(12) United States Patent
Cheah et al.

(10) Patent No.: US 11,037,874 B2
(45) Date of Patent: Jun. 15, 2021

(54) PLANE-LESS VOLTAGE REFERENCE INTERCONNECTS

(71) Applicant: Intel Corporation, Santa Clara, CA (US)

(72) Inventors: Bok Eng Cheah, Bukit Gambir (MY); Jackson Chung Peng Kong, Tanjung Tokong (MY); Jenny Shio Yin Ong, Bayan Lepas (MY); Seok Ling Lim, Kulim (MY)

(73) Assignee: Intel Corporation, Santa Clara, CA (US)

( * ) Notice: Subject to any disclaimer, the term of this patent is extended or adjusted under 35 U.S.C. 154(b) by 86 days.

(21) Appl. No.: 16/450,287

(22) Filed: Jun. 24, 2019

(65) Prior Publication Data
US 2020/0135639 A1    Apr. 30, 2020

(30) Foreign Application Priority Data
Oct. 29, 2018   (MY) .......................... PI 2018704000

(51) Int. Cl.
| | | |
|---|---|---|
| H01L 23/48 | (2006.01) | |
| H01L 23/522 | (2006.01) | |
| H01L 23/552 | (2006.01) | |
| H01L 23/528 | (2006.01) | |
| H01L 23/00 | (2006.01) | |

(52) U.S. Cl.
CPC ........ *H01L 23/5226* (2013.01); *H01L 23/528* (2013.01); *H01L 23/552* (2013.01); *H01L 24/09* (2013.01)

(58) Field of Classification Search
CPC . H01L 23/5226; H01L 23/528; H01L 23/552; H01L 24/09
USPC .......................................... 257/774, 698, 781
See application file for complete search history.

(56) References Cited

U.S. PATENT DOCUMENTS

| | | | | |
|---|---|---|---|---|
| 5,262,352 A | * | 11/1993 | Woo ..................... | H01L 23/5226 438/625 |
| 6,936,913 B2 | * | 8/2005 | Akerling ............... | H01L 23/481 257/686 |
| 10,192,784 B1 | * | 1/2019 | Cui ....................... | H01L 23/528 |
| 2003/0160325 A1 | * | 8/2003 | Yoneda .................. | H01L 24/16 257/758 |
| 2013/0341701 A1 | * | 12/2013 | Blomme ............... | H01L 21/764 257/324 |

(Continued)

*Primary Examiner* — Nitin Parekh
(74) *Attorney, Agent, or Firm* — Schwegman Lundberg & Woessner, P.A.

(57) ABSTRACT

An electronic device comprises an integrated circuit (IC) die including a first plurality of contact pads; and a plurality of stacked interconnect layers. The plurality of stacked interconnect layer include a first interconnect layer including a first conductive plane, a first vertical interconnect portion, and dielectric material isolating the first vertical interconnect portion from the first conductive plane; and a second interconnect layer including a second conductive plane contacting the first conductive plane, a second vertical interconnect portion contacting the first vertical interconnect portion, and the dielectric material isolating the second vertical interconnect portion from the second conductive plane; wherein the first and second vertical interconnect portions are included in a first vertical interconnect through the first and second conductive planes that contacts a first contact pad of the first plurality of contact pads.

16 Claims, 6 Drawing Sheets

(56) References Cited

U.S. PATENT DOCUMENTS

2014/0061924 A1\* 3/2014 Chen ................. H01L 23/528
    257/758
2016/0293621 A1\* 10/2016 Huang ............. H01L 27/11582

\* cited by examiner

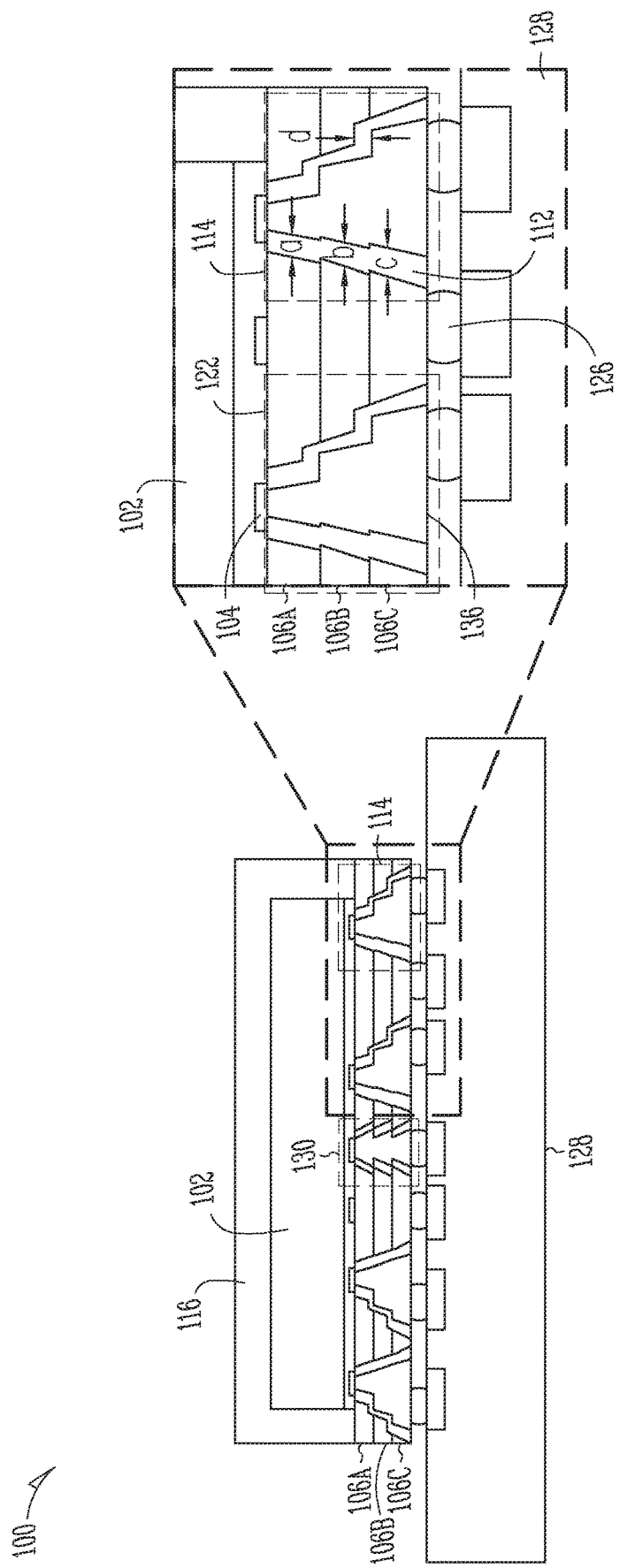

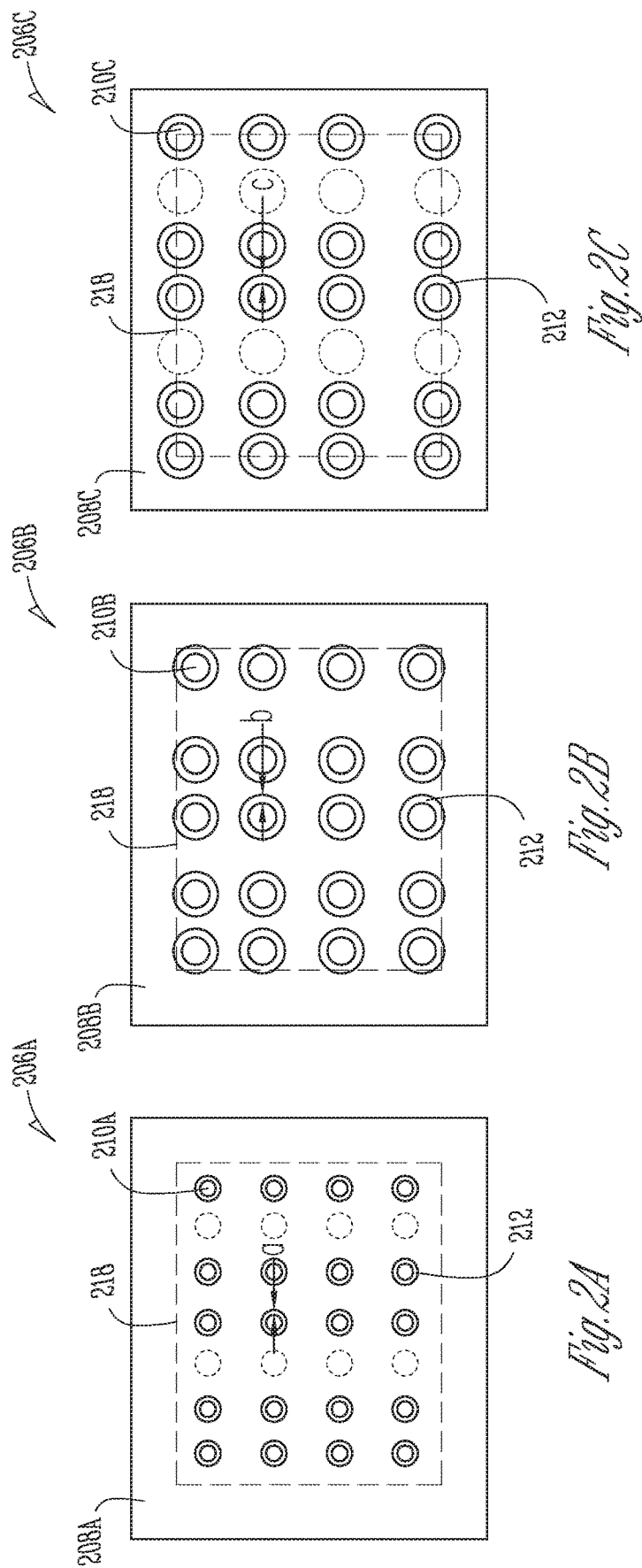

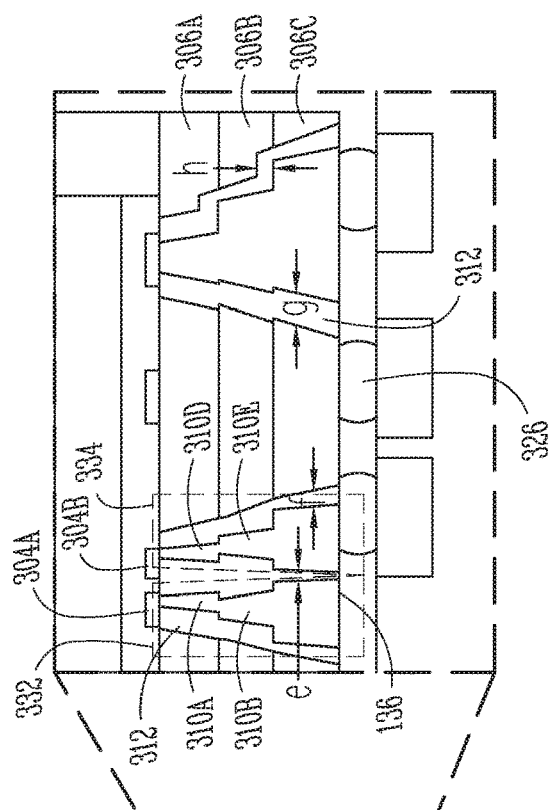
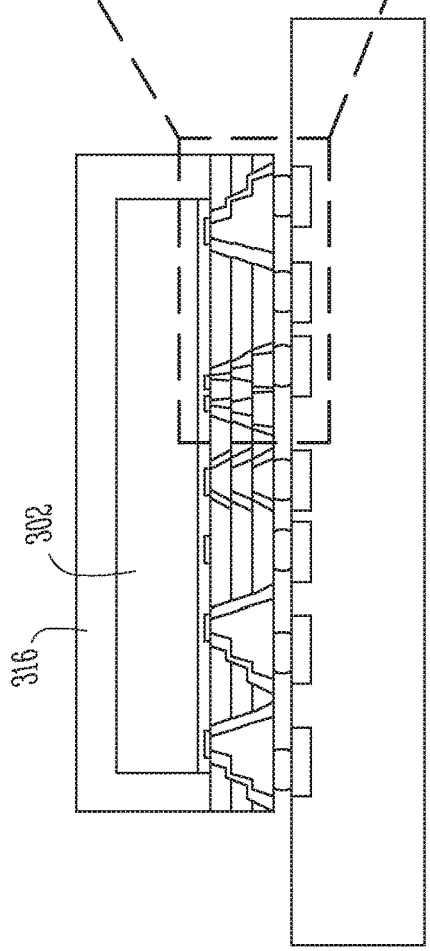
Fig. 3B
Fig. 3A

US 11,037,874 B2

PLANE-LESS VOLTAGE REFERENCE INTERCONNECTS

PRIORITY APPLICATION

This application claims the benefit of priority to Malaysian Application Serial Number PI 2018704000, filed Oct. 29, 2018, which is incorporated herein by reference in its entirety.

TECHNICAL FIELD

Embodiments pertain to packaging of electronic circuits. Some embodiments relate to IC package interconnection of integrated circuits.

BACKGROUND

Electronic devices (e.g., mobile phones, smart phones, tablet computers, wearables, e-readers, etc.) are continually being designed to add more complicated functionality while reducing the physical size of the devices. Improving the functionality often includes increasing the speed of electrical signals, while reducing the size can include positioning the conductive traces carrying the signals closer together. However, high speed signaling can lead to electromagnetic noise issues such as signal crosstalk or corruption of electrical signals by circuit power noise.

BRIEF DESCRIPTION OF THE DRAWINGS

FIGS. 1A and 1B are illustrations of an embodiment of an electronic device in accordance with some embodiments;

FIGS. 2A-2C are illustrations of interconnect layers of an electronic device in accordance with some embodiments;

FIGS. 3A and 3B are illustrations of another embodiment of an electronic device in accordance with some embodiments;

DETAILED DESCRIPTION

Figure 4A:
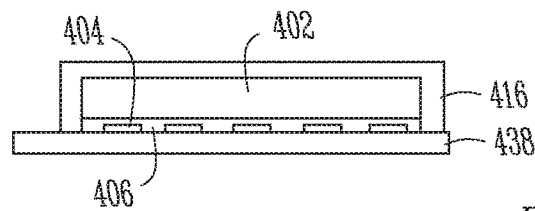
FIGS. 4A-4I illustrate a process flow for a method 400 of making an electronic device.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The devices, systems, and methods described herein improve electromagnetic isolation for electrical signals in high-speed electronic circuit designs, which allows for miniaturization of the electronic designs. Conventional electronic packaging or advanced wafer-level packaging design commonly requires electrical signals and circuit power planes to be routed in close-proximity or adjacent to (e.g., in a vertical direction) a circuit ground voltage ($V_{SS}$) reference plane to provide a robust current return path. Additional reference voltage planes are included in the circuit layout for strip-line routing of the electrical signals.

This approach is used to try to ensure minimum electromagnetic interference, such as by reducing crosstalk coupling noise to the signals and reducing loop-inductance due to power delivery and return loops in the circuits. For example, an electronic package design with one layer of signal routing and one power plane may require at least a 4-layer package stack-up. An electronic package design with two signal routing layers and two power planes may require up to 6 or 8 package layers. Each additional package layer adds cost, especially for advanced wafer-level packaging designs. An improved approach uses a plane-less voltage referencing to provide electromagnetic shielding.

FIGS. 1A and 1B are illustrations of an embodiment of an electronic device 100. As shown in FIG. 1A, the electronic device 100 includes an integrated circuit (IC) die and multiple interconnect layers external to the IC die. As shown in FOG. 1B, the IC die 102 includes multiple contact pads 104. The interconnect layers are arranged in a stack of layers. Three interconnect layers 106A-C are shown in the example embodiment of FIGS. 1A and 11B to simplify the illustration. An actual implementation may have many such layers. Each interconnect layer includes a conductive plane and portions of vertical interconnects within the conductive planes. The portions form a vertical interconnect when the conductive planes are stacked in a manner so that the individual portions are electrically connected. FIG. 1A also shows a mold layer 116 that at least partially covers the IC die 102 and contacts at least the first interconnect layer.

FIG. 2A is an illustration of an example embodiment of a first interconnect layer 206A. The interconnect layer 206A may be a top view of interconnect layer 106A in FIG. 1B. The interconnect layer 206A includes a conductive plane 208A, vertical interconnect portions including vertical interconnect portion 210A, and dielectric material 212 that isolates the vertical interconnect portions from the conductive plane 208A. The vertical interconnect portions and dielectric material 212 are shown as round, but may have other shapes (e.g., one or more of a square shape, a rectangular shape, and an oblong shape). Twenty vertical interconnect portions are shown in the example embodiment of FIG. 2A, but an actual implementation may have many more (e.g., one hundred) vertical interconnect portions. FIG. 2A also shows the footprint 218 of the IC die. The mold layer may extend to the edge of the conductive plane 208A or can encapsulate all the conductive planes and the interconnect layers. Although just one IC die is shown in the example embodiments of FIGS. 1A, 1B and FIG. 2, the interconnect layers can be used for connections to more than one IC die.

FIG. 2B is an illustration of an example embodiment of a second interconnect layer 206B. The interconnect layer 206B may be a top view of interconnect layer 106B in FIG. 1B. The interconnect layer 206B includes a second conductive plane 208B, a vertical interconnect portion 210B, and dielectric material 212 that isolates the vertical interconnect portion 210B from the conductive plane 208B. The vertical interconnect portions 210A and 210B are aligned so that they are included in a vertical interconnect. As shown in the example embodiment of FIG. 1B, the vertical interconnect 114 extends through the first and second conductive planes 208A, 208B and contacts a contact pad of the IC die 102.

The diameter of the vertical interconnect portion 210B can be greater than the diameter of the vertical interconnect portion 210A of the first interconnect layer to facilitate their alignment. The thickness of the dielectric material 112, 212 (shown as "a" and "b" in FIG. 1B and FIGS. 2A and 2B) in the interconnect layers is made the same to minimize impedance mismatch.

FIG. 2C is an illustration of an example embodiment of a subsequent (e.g., third) interconnect layer 206C. The interconnect layer 206C may be a top view of interconnect layer 106C in FIG. 1B. The subsequent interconnect layer 206C includes a conductive plane 208C, a vertical interconnect portion 210C, and dielectric material 212 that isolates the vertical interconnect portion 210C from the conductive plane 208C. The vertical interconnect portions 210A, 210B and 210C of the three interconnect layers are aligned so that they are included in a vertical interconnect. As shown in the example embodiment of FIG. 1B, the vertical interconnect 114 extends through the conductive planes and the three interconnect layers 106A, 106B and 106C. The third interconnect layer 106C can include contact pads on the bottom surface of the electronic device to contact solder balls of a solder ball grid array. The vertical interconnect formed by vertical interconnect portions 210A, 210B, 210C can provide electrical continuity between a solder ball contact and a contact pad of the IC die 102.

The diameter of the vertical interconnect portion 210C can be greater than the diameters of the vertical interconnect portions 210A and 210B. The expanded view of FIG. 1B shows the stacked interconnect layers 106A, 106B and 106C and two vertical interconnects 122 and 114. The expanded view also shows the differences in diameters between the portions of the vertical interconnect. The thicknesses of the dielectric material 112 (shown as a, b, c, and d in FIG. 1B) in the interconnect layers are the same to minimize impedance mismatches. Thickness "d" represents the thickness of the dielectric at a plane ledge formed by the difference in diameters between the second and third vertical interconnect portions. The plane ledge may isolate the third vertical interconnect portion (210C in FIG. 2) from the second conductive plane (208B in FIG. 2).

The dielectric material 112 isolates the vertical interconnects 122, 114 from the conductive planes. The conductive planes may be stacked and are in electrical contact with each other. FIG. 1B shows a solder ball 126 that is associated with a reference voltage of circuit board 128 electrically coupled to the third conductive plane. The connection to the circuit board 128 results in the conductive planes forming a conductive reference that extends in a vertical direction as well as the horizontal direction. In variations, the reference voltage is a ground reference voltage ($V_{SS}$) and the solder ball provides a contact to $V_{SS}$ of circuit board 128. The stacked conductive planes form a conductive ground reference that extends horizontally and vertically in the interconnect layers, and the ground reference isolates the vertical interconnects 122 and 114. The stacked conductive planes may be blend together during the formation process. A structure formed by stacked planes may show plane ledges after formation, and the vertical interconnect may show terracing when formed by the stacking.

Vertical interconnect 114 may be used to route an input-out (I/O) signal vertically in the interconnect layers, and vertical interconnect 122 may be used to route a circuit supply connection (e.g., $V_{CC}$) vertically in the interconnect layers. The conductive reference formed by the planes isolates the vertical interconnects in the horizontal and vertical directions. FIG. 1A also shows an example of a vertical interconnect 130 where the diameters of the vertical interconnect portions have a uniform diameter.

FIGS. 3A and 3B are illustrations of another embodiment of an electronic device. As shown in FIG. 3A, the electronic device 300 includes an IC die 302, multiple interconnect layers external to the IC die 302, and a mold layer 316 at partially covering the IC die 302. Each interconnect includes a conductive plane and portions of vertical interconnects within the conductive plane. As shown in FIG. 3B, the first interconnect layer 306A includes a first conductive plane, a first vertical interconnect portion 310A, and a dielectric material 312 isolating the first vertical interconnect portion from the first conductive plane. The second interconnect layer 306B includes a second conductive plane, a second vertical interconnect portion 310B, and dielectric material 312 that isolates the second vertical interconnect portion from the second conductive plane.

The main difference in FIGS. 3A and 3B from the example embodiment of FIGS. 1A and 1B is that multiple vertical interconnect portions reside within the dielectric material 312 without being separated by a portion of the conductive plane. For example, in FIG. 3B the first interconnect layer 306A includes a third vertical interconnect portion 310D that is isolated from the first vertical interconnect portion 310A only by the dielectric material 312 and the two portions are not separated by a conductive portion of the conductive plane. The second interconnect layer 306B includes a fourth vertical interconnect portion 310E that is isolated from the second vertical interconnect portion 310B only by the dielectric material 312.

The first and second vertical interconnect portions 310A, 310B are included in a first vertical interconnect 332 that contacts a first contact pad 304A of the IC die, and the third and fourth vertical interconnect portions 310D, 310E are included in a second vertical interconnect 334 that contacts a first contact pad 304B of the IC die. The first and second contact pads may be associated with a differential I/O signal pair. The stacked conductive planes may be electrically coupled to a reference voltage using solder ball 326 to form a conductive reference that extends vertically and horizontally in the interconnect layers. The differential I/O signal pair are separated from each other by the dielectric material and are isolated from other vertical interconnects by the conductive reference that surrounds the first and second vertical interconnects 332, 334.

The spacing in the dielectric material 312 between the vertical interconnects (shown as "e" in FIG. 3B) is smaller than the thickness of the dielectric material that separates the vertical interconnects from the conductive planes (shown as "f" in FIG. 3B). Thickness "g" is the thickness between the single vertical interconnect and the conductive plane and thickness "h" is the thickness of the dielectric at a plane ledge formed by the difference in diameters between the second and third vertical interconnect portions of the single vertical interconnect.

FIGS. 4A-4I illustrate a process flow for a method 400 of making an electronic device, such as for example the electronic device of FIG. 1 that includes an IC die and interconnect layers. The IC dies are fabricated, and the chips may be singulated. The contact pads 404 of the chips can be attached to a carrier 438 as shown in FIG. 4A. The gaps between the chips can be filled to form an artificial wafer. This is sometimes referred to as wafer reconstitution. As shown in FIG. 4A, a mold layer 416 can be added to the IC die 402. The mold layer can be formed using a compression molding process, an injection molding process, or a transfer molding process. An insulative layer 406 isolates the contact pads 404 on the IC die. In variations, the insulative layer 406 covers the contact pads 404. In variations, the mold material covers the contact pads 404.

Figure 4B:
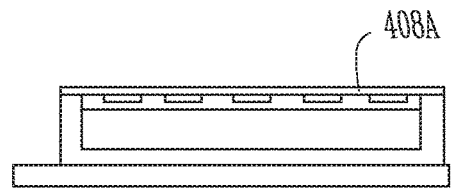

In FIG. 4B, a first conductive plane 408A is formed on the contact pads 404 and the insulative layer 406. The first conductive plane 408A can comprise metal (e.g., copper) and can be disposed on the insulative layer using a metallization process such as one or both of electroplating and metal bonding (e.g., a metal compression or a metal lamination process).

Figure 4C:
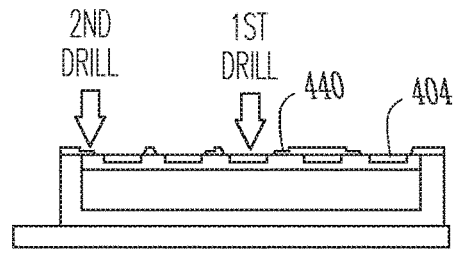

In FIG. 4C, openings are formed in the first conductive plane 408A and on a portion of the insulative layer 406 to expose the contact pads 404 of the IC. The openings can be formed using silicon etching or silicon drilling (e.g., one or more of mechanical drilling, laser drilling, or ultra-violet laser drilling). Because laser drilling typically evaporates the material being worked it can provide a cleaner cavity without material cracking or melting. In certain embodiments, a first drilling can be used to expose the contact pads 404, and a second drilling can be used to expose the plane ledge 440 of the conductive plane.

Figure 4D:
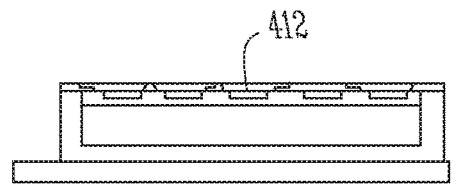

In FIG. 4D, a dielectric material 412 is disposed in the openings formed in the opening that exposed the contact pads. The dielectric material can be disposed using one or more of a lamination process, a dispensing process or a sputtering process.

Figure 4E:
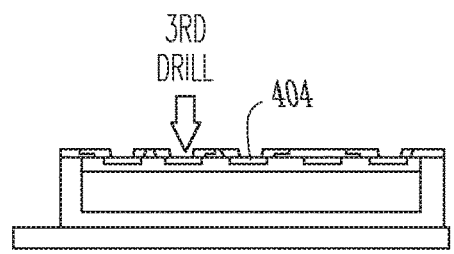
Figure 4F:
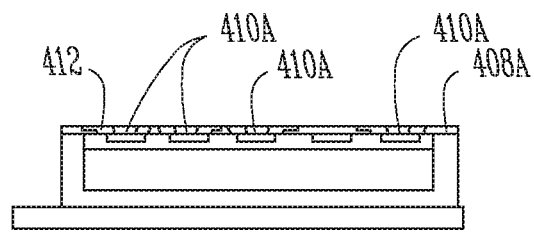

In FIG. 4E openings are formed in the dielectric material to again expose the contact pads 404 of the IC die. The openings can be formed using an etching or a drilling process. In FIG. 4F, a conductive material (e.g., a metal) disposed in the openings in the dielectric material to form the vertical interconnection portions 410A of the first conductive plane 408A. The first vertical interconnect portions 410A contact the contact pads 404 of the IC die and are isolated from the first conductive plane 408A by the dielectric material 412.

Figure 4G:
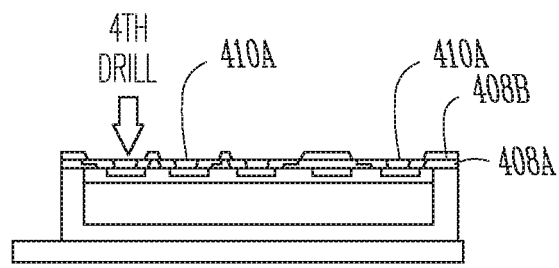

In FIG. 4G, a second conductive plane 408B is formed on the first conductive plane 408A. Openings are formed in the second conductive plane 408B to expose the first vertical interconnect portions 410A. As in FIGS. 4D-4F, the openings are filled with a dielectric material, and openings are formed in the dielectric material to again expose the first interconnect portions. The openings may have a greater diameter than the openings formed in FIG. 4E.

Figure 4H:
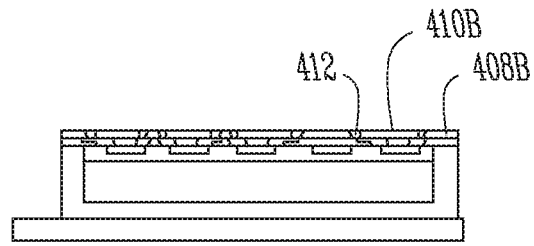

In FIG. 4H, the conductive material is disposed in the openings in the dielectric material to form the second vertical interconnect portions 410B of the second conductive plane 408B. The second vertical interconnect openings 410B are in electrical contact with the first vertical interconnect portions 410A and are isolated from the second conductive plane by the dielectric material 412. The second vertical interconnect portions 410B may have a greater diameter than the first vertical interconnect portions. The first vertical interconnect portions 410A and the second vertical interconnect portions 410B are included in vertical interconnects that extend through, but are isolated from, the first and second conductive planes.

Figure 4I:
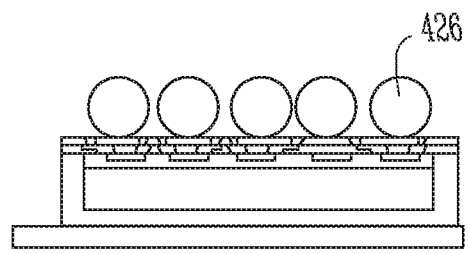

Ball grid array (BGA) contacts can be formed on the second vertical interconnect portions. In FIG. 4I, solder balls 426 are added to form the solder BGA. The solder balls can be disposed on the BGA contacts using one or both of a surface mounting process or a solder reflow process. In some embodiments, the processes of FIGS. 4G and 4H can be continued to add one or more subsequent conductive planes and vertical interconnect portions to add additional interconnect layers before the BGA contacts are formed on the last layer.

In the embodiments of FIGS. 4A-4I, only one vertical interconnect portion is formed in one opening of dielectric material. In some embodiments, multiple vertical interconnect portions can be formed in the opening. For example, two vertical interconnect portions can be formed in one dielectric material deposit. Two openings can be formed in the dielectric material to expose two contact pads of the IC die. Two vertical interconnect portions are formed in the two openings that are separated by only the dielectric material. These portions can be used to form two vertical interconnects separated by only dielectric material as in the vertical interconnects 332 and 334 of FIG. 3.

Returning to FIG. 1, the IC die 102 and the interconnect layers are electrically coupled to circuit board 128. The IC die includes a first set of contact pads 104 and the bottom interconnect layer includes a second set of contact pads 136 for bonding to the solder ball grid array and the circuit board. The vertical interconnects of the interconnect layers provide electrical continuity between the second set of contact pads and the first set of contact pads.

Figure 5:
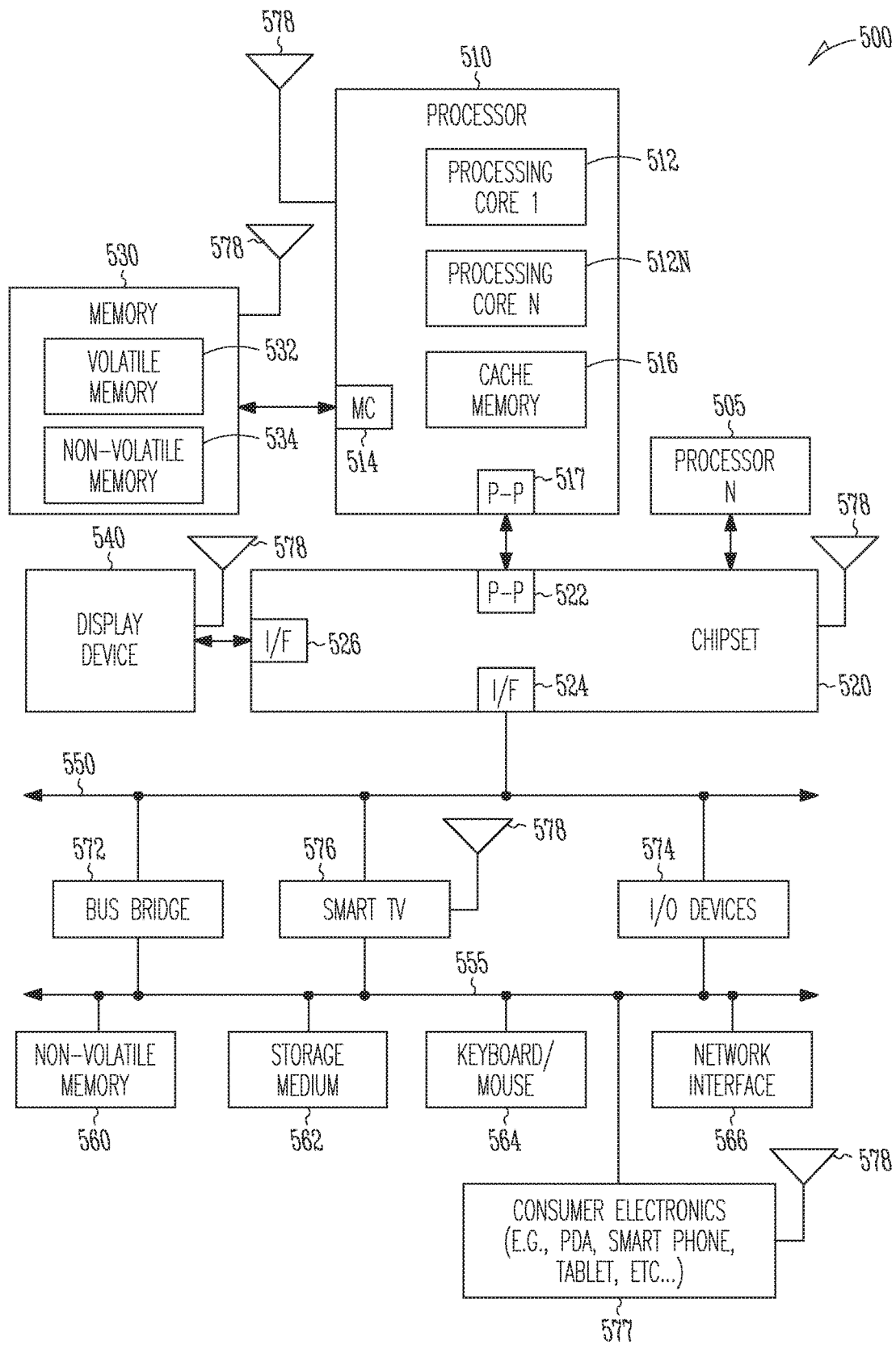
FIG. 5 is a system level diagram in accordance with some embodiments.

FIG. 5 illustrates a system level diagram, according to one embodiment of the invention. For instance, FIG. 5 depicts an example of an electronic device (e.g., system) that can include one or more IC die coupled to a circuit board using the interconnect layers as described in the present disclosure. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system. In one example, two or more systems as shown in FIG. 5 may be coupled together, or two or more portions of the system may be coupled together, using the interconnect layers as described in the present disclosure.

In one embodiment, processor 510 has one or more processing cores 512 and 512N, where N is a positive integer and 512N represents the Nth processor core inside processor 510. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, the interface to the wireless antenna 578 operates in accordance with, but is not limited to, the IEEE 802.11 standard and its related family, Home Plug AV (HPAV), Ultra-Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the invention, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices 572, 576, 574, 560, 562, 564, 566, 577, etc. Buses 550 and 555 may be interconnected together via a bus bridge 572. Chipset 520 connects to one or more buses 550 and 555 that interconnect various elements 574, 560, 562, 564, and 566. Chipset 520 may also be coupled to a wireless antenna 578 to communicate with any device configured to transmit and/or receive wireless signals. Chipset 520 connects to display device 540 via interface (I/F) 526. Display 540 may be, for example, a liquid crystal display (LCD), a plasma display, cathode ray tube (CRT) display, or any other form of visual display device. In some embodiments of the invention, processor 510 and chipset 520 are merged into a single SOC. In one embodiment, chipset 520 couples with (e.g., via interface 524) a non-volatile memory 560, a mass storage medium 562, a keyboard/mouse 564, and a network interface 566, I/O devices 574, smart TV 576, consumer electronics 577 (e.g., PDA, Smart Phone, Tablet, etc.).

In one embodiment, mass storage medium 562 includes, but is not limited to, a solid-state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra-Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

The devices, systems, and methods described herein provide more robust electromagnetic noise shielding for electrical signals and circuit power. The enhanced power delivery connection between a circuit board and ICs uses a tighter power-to-ground referencing that reduces jitter in electronic circuits. The improved electromagnetic shielding reduces the number of reference layers needed in a conventional approach. Reducing the number of reference layers produces a thinner form factor for the electronic devices and reduces the number of routing layers needed. The improved electromagnetic shielding reduces the loop-inductance of the devices, which results in less complicated solutions for decoupling of electromagnetic interference.

Additional Description and Examples

Example 1 includes subject matter (such as an electronic device) comprising an integrated circuit (IC) die and a plurality of stacked interconnect layers. The IC die includes a first plurality of contact pads. The plurality of stacked interconnect layers includes a first interconnect layer and a second interconnect layer. The first interconnect layer includes a first conductive plane, a first vertical interconnect portion, and dielectric material isolating the first vertical interconnect portion from the first conductive plane. The second interconnect layer includes a second conductive plane contacting the first conductive plane, a second vertical interconnect portion contacting the first vertical interconnect portion, and the dielectric material isolating the second vertical interconnect portion from the second conductive plane. The first and second vertical interconnect portions are included in a first vertical interconnect through the first and second conductive planes that contacts a first contact pad of the first plurality of contact pads.

In Example 2, the subject matter of Example 1 optionally includes the first vertical interconnect portion having a first diameter and the second vertical interconnect portion has a second diameter and the second diameter is greater than the first diameter.

In Example 3, the subject matter of one or both of Examples 1 and 2 optionally includes a second plurality of contact pads disposed on a first surface of the electronic device. The first vertical interconnect provides electrical continuity between the first contact pad of the first plurality of contact pads and a first contact pad of the second plurality of contact pads.

In Example 4, the subject matter of Example 3, optionally includes a second contact pad of the second plurality of contact pads being associated with a reference voltage and provides electrical continuity of the reference voltage to the first and second conductive planes.

In Example 5, the subject matter of one or any combination of Examples 1-4 optionally includes a plurality of stacked interconnect layers that includes: a subsequent interconnect layer that includes a subsequent conductive plane contacting the second conductive plane, a subsequent vertical interconnect portion contacting the second vertical interconnect portion, and the dielectric material isolating the subsequent vertical interconnect portion from the subsequent conductive plane; wherein the subsequent vertical interconnect portion, the second vertical interconnect portion and the first vertical interconnect portion are included in the first vertical interconnect.

In Example 6, the subject matter of Example 5 optionally includes a first vertical interconnect portion has a first diameter, the second vertical interconnect portion has a second diameter, the subsequent vertical interconnect portion has a third diameter, and the second diameter is greater than the first diameter and the third diameter is greater than the second diameter.

In Example 7, the subject matter of one or both of Examples 5 and 6 optionally includes the first, second and subsequent conductive planes are included in a conductive reference that extends horizontally and vertically in the plurality of stacked interconnect layers.

In Example 8, the subject matter of Example 7 optionally includes the dielectric material isolating the first vertical interconnect from the conductive reference.

In Example 9, the subject matter of one or any combination of Examples 1-8 optionally includes the first interconnect layer including a third vertical interconnect portion isolated from the first conductive plane by the dielectric material, and the second interconnect layer includes a fourth vertical interconnect portion isolated from the second conductive plane by the dielectric material. The third and fourth vertical interconnect portions are included in a second vertical interconnect through the first and second conductive planes that contacts a second contact pad of the first plurality of contact pads.

In Example 10, the subject matter of Example 9 optionally includes the first contact pad of the first plurality of contact pads is associated with an input out (I/O) signal and the second contact pad of the first plurality of contact pads is associated with a supply connection for the IC.

In Example 11, the subject matter of Example 9 optionally includes the first and second contact pads of the first plurality of contact pads being associated with a differential input out (I/O) signal pair.

In Example 12, the subject matter of one or any combination of Examples 9-11 optionally includes the third vertical interconnect portion being isolated from the first vertical interconnect portion by the dielectric material in the first interconnect layer, and the fourth vertical interconnect portion is isolated from the second vertical interconnect portion by the dielectric material in the second interconnect layer.

In Example 13, the subject matter of one or any combination of Examples 1-12 optionally includes a mold layer at least partially covering the IC die and contacting the first interconnect layer.

Example 14 includes subject matter (such as a method of forming an electronic device), or can optionally be combined with one or any combination of Examples 1-13 to include such subject matter, comprising forming a mold layer to cover an integrated circuit (IC) die; forming a first conductive plane on an insulative layer and contact pads of the IC die; forming a plurality of first vertical interconnect portions in the first conductive plane that contact the contact pads of the IC die and are isolated from the first conductive plane; forming a second conductive plane on the first conductive plane; and forming a plurality of second vertical interconnect portions in the second conductive plane that contact the first vertical interconnect portions and are isolated from the second conductive plane, wherein the first and second vertical interconnect portions are included in vertical interconnects that extend through the first and second conductive planes.

In Example 15, the subject matter of Example 14 optionally includes forming openings in the first conductive plane and on a portion of the insulative layer to expose the first plurality of contact pads of the IC die; disposing a dielectric material in the plurality of openings; forming openings in the dielectric material to expose the first plurality of contact pads; and disposing a conductive material in the openings in the dielectric material to form the plurality of first vertical interconnect portions, wherein the dielectric material isolates the first vertical interconnect portions from the first conductive plane.

In Example 16, the subject matter of Example 15 includes forming the openings in the first conductive plane and in the dielectric material using at least one of laser drilling or etching.

In Example 17, the subject matter of one or any combination of Examples 14-16 optionally includes forming openings in the second conductive plane to expose the plurality of first vertical interconnect portions; disposing a dielectric material in the plurality of openings; forming openings in the dielectric material to expose the plurality of first vertical interconnect portions; and disposing a conductive material in the openings in the dielectric material to form the plurality of second vertical interconnect portions, wherein the dielectric material isolates the second vertical interconnect portions from the second conductive plane.

In Example 18, the subject matter of one or any combination of Examples 14-17 optionally includes forming the plurality of second vertical interconnect portions to have a diameter greater than the diameter of the first vertical interconnect portions.

In Example 19, the subject matter of Example 18 optionally includes forming a subsequent conductive plane on the first conductive plane; and forming a plurality of subsequent vertical interconnect portions in the subsequent conductive plane that contact the second vertical interconnect portions and are isolated from the subsequent conductive plane. The subsequent vertical interconnect portions have a diameter greater than the diameter of the second vertical interconnect portions, and wherein the first, second and third vertical interconnect portions are included in vertical interconnects that extend through the first, second and subsequent conductive planes.

In Example 20, the subject matter of one or any combination of Examples 14-19 optionally includes forming a second plurality of contact pads that contact the vertical interconnects; and forming solder balls on the second plurality of contact pads, wherein the vertical interconnects provide electrical continuity from the solder balls to the first plurality of contact pads of the IC die.

In Example 21, the subject matter of one or any combination of Examples 14-20 optionally includes forming a first vertical interconnect separated from a second vertical interconnect by only the dielectric material.

In Example 22, the subject matter of Example 21 optionally includes forming an opening in the first conductive plane and on a portion of the insulative layer, wherein two contact pads of the IC die are exposed by the opening; disposing the dielectric material in the opening; forming two openings in the dielectric material to expose the two contact pads; and disposing a conductive material in the two openings to form two first vertical interconnect portions, wherein each of the two first vertical interconnect portions is included in one of the first vertical interconnect or the second vertical interconnect.

Example 23 includes subject matter (such as an electronic system) or can optionally be combined with one or any combination of Examples 1-22 to include such subject matter, comprising a circuit board and an electronic device mounted on the circuit board. The electronic device includes at least one integrated circuit (IC) die including a first plurality of contact pads; and a plurality of stacked interconnect layers. The stacked interconnect layers include: a first interconnect layer including a first conductive plane, a first vertical interconnect portion, and dielectric material isolating the first vertical interconnect portion from the first conductive plane; a second interconnect layer including a second conductive plane contacting the first conductive plane, a second vertical interconnect portion contacting the first vertical interconnect portion, and the dielectric material isolating the second vertical interconnect portion from the second conductive plane; and a second plurality of contact pads bonded to the circuit board. The first and second vertical interconnect portions are included in a first vertical interconnect through the first and second conductive planes that provides electrical continuity between a contact pad of the second plurality of contact pads and a contact pad of the first plurality of contact pads.

In Example 24, the subject matter of Example 23 optionally includes the first vertical interconnect portion has a first diameter and the second vertical interconnect portion has a second diameter, and the second diameter is greater than the first diameter.

In Example 25, the subject matter of one or both of Examples 23 and 24 optionally include the first and second conductive planes being included in a conductive reference that extends horizontally and vertically in the plurality of stacked interconnect layers.

These non-limiting examples can be combined in any permutation or combination. The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An electronic device comprising:
   an integrated circuit (IC) die including a first plurality of contact pads; and
   a plurality of stacked interconnect layers including:
   a first interconnect layer including a first conductive plane, a first vertical interconnect portion, and dielectric material isolating the first vertical interconnect portion from the first conductive plane; and
   a second interconnect layer including a second conductive plane contacting the first conductive plane, a second vertical interconnect portion contacting the first vertical interconnect portion, and the dielectric material isolating the second vertical interconnect portion from the second conductive plane;
   wherein the first and the second vertical interconnect portions are included in a first vertical interconnect through the first and the second conductive planes respectively, that contact a first contact pad of the first plurality of contact pads.

2. The electronic device of claim 1, wherein the first vertical interconnect portion has a first diameter and the second vertical interconnect portion has a second diameter and the second diameter is greater than the first diameter.

3. The electronic device of claim 1, including a second plurality of contact pads disposed on a first surface of the electronic device, wherein the first vertical interconnect provides electrical continuity between the first contact pad of the first plurality of contact pads and a first contact pad of the second plurality of contact pads.

4. The electronic device of claim 3, wherein a second contact pad of the second plurality of contact pads is associated with a reference voltage and provides electrical continuity of the reference voltage to the first and the second conductive planes.

5. The electronic device of claim 1, wherein the plurality of stacked interconnect layers includes:
   a subsequent interconnect layer that includes a subsequent conductive plane contacting the second conductive plane, a subsequent vertical interconnect portion contacting the second vertical interconnect portion, and the dielectric material isolating the subsequent vertical interconnect portion from the subsequent conductive plane;
   wherein the subsequent vertical interconnect portion, the second vertical interconnect portion and the first vertical interconnect portion are included in the first vertical interconnect.

6. The electronic device of claim 5, wherein the first vertical interconnect portion has a first diameter, the second vertical interconnect portion has a second diameter, the subsequent vertical interconnect portion has a third diameter, and the second diameter is greater than the first diameter and the third diameter is greater than the second diameter.

7. The electronic device of claim 5, wherein the first, second and subsequent conductive planes are included in a conductive reference that extends horizontally and vertically in the plurality of stacked interconnect layers.

8. The electronic device of claim 7, wherein the dielectric material isolates the first vertical interconnect from the conductive reference.

9. The electronic device of claim 1,
   wherein the first interconnect layer includes a third vertical interconnect portion isolated from the first conductive plane by the dielectric material, and the second interconnect layer includes a fourth vertical interconnect portion isolated from the second conductive plane by the dielectric material; and
   wherein the third and fourth vertical interconnect portions are included in a second vertical interconnect through the first and the second conductive planes that contact a second contact pad of the first plurality of contact pads.

10. The electronic device of claim 9, wherein the first contact pad of the first plurality of contact pads is associated with an input out (I/O) signal and the second contact pad of the rust plurality of contact pads is associated with a supply connection for the IC.

11. The electronic device of claim 9, wherein the first and the second contact pads of the first plurality of contact pads are associated with a differential input out (I/O) signal pair.

12. The electronic device of claim 9, wherein the third vertical interconnect portion is isolated from the first vertical interconnect portion by the dielectric material in the first interconnect layer, and the fourth vertical interconnect portion is isolated from the second vertical interconnect portion by the dielectric material in the second interconnect layer.

13. The electronic device of claim 1, including a mold layer at least partially covering the IC die and contacting the first interconnect layer.

14. An electronic system comprising:
   a circuit board;
   an electronic device mounted on the circuit board, the electronic device including:
   at least one integrated circuit (IC) die including a first plurality of contact pads; and
   a plurality of stacked interconnect layers including:
   a first interconnect layer including a first conductive plane, a first vertical interconnect portion, and dielectric material isolating the first vertical interconnect portion from the first conductive plane;
   a second interconnect layer including a second conductive plane contacting the first conductive plane, a second vertical interconnect portion contacting the first vertical interconnect portion, and the dielectric material isolating the second vertical interconnect portion from the second conductive plane; and
   a second plurality of contact pads bonded to the circuit board;
   wherein the first and second vertical interconnect portions are included in a first vertical interconnect through the first and the second conductive planes that provide electrical continuity between a contact pad of the second plurality of contact pads and a contact pad of the first plurality of contact pads.

15. The electronic system of claim 14, wherein the first vertical interconnect portion has a first diameter and the second vertical interconnect portion has a second diameter, and the second diameter is greater than the first diameter.

16. The electronic system of claim 14, wherein the first and the second conductive planes are included in a conductive reference that extends horizontally and vertically in the plurality of stacked interconnect layers.

\* \* \* \* \*

UNITED STATES PATENT AND TRADEMARK OFFICE
CERTIFICATE OF CORRECTION

PATENT NO. : 11,037,874 B2
APPLICATION NO. : 16/450287
DATED : June 15, 2021
INVENTOR(S) : Cheah et al.

Page 1 of 1

It is certified that error appears in the above-identified patent and that said Letters Patent is hereby corrected as shown below:

In the Claims

In Column 12, Line 29, in Claim 10, delete "rust" and insert --first-- therefor

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*